(12) United States Patent
Enomoto et al.

(10) Patent No.: US 10,096,416 B2
(45) Date of Patent: Oct. 9, 2018

(54) MAGNETIZING APPARATUS AND MAGNETIZING METHOD

(71) Applicant: Tokyo Electron Limited, Tokyo (JP)

(72) Inventors: Tadashi Enomoto, Iwate (JP); Makoto Saito, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 15/242,783

(22) Filed: Aug. 22, 2016

(65) Prior Publication Data
US 2017/0062112 A1 Mar. 2, 2017

(30) Foreign Application Priority Data

Aug. 28, 2015 (JP) ................. 2015-169219

(51) Int. Cl.
*H01F 13/00* (2006.01)
*H01L 43/12* (2006.01)

(52) U.S. Cl.
CPC .......... *H01F 13/003* (2013.01); *H01L 43/12* (2013.01)

(58) Field of Classification Search
CPC .................. H01L 43/12; H01F 13/003
See application file for complete search history.

(56) References Cited

U.S. PATENT DOCUMENTS

| 3,418,613 | A * | 12/1968 | Trikilis ............... H01F 13/003 324/228 |
| 2007/0261764 | A1* | 11/2007 | Nakamura ........... H01F 13/003 148/100 |
| 2008/0012672 | A1* | 1/2008 | Stenerson ............ H01F 13/003 335/284 |
| 2008/0016678 | A1* | 1/2008 | Creighton, IV ...... H01F 13/003 29/607 |
| 2014/0111296 | A1* | 4/2014 | Fullerton ................. H01F 7/02 335/284 |

FOREIGN PATENT DOCUMENTS

JP 2014-183280 A 9/2014
WO WO 2013063273 A1 * 5/2013 ............... H01F 7/02

* cited by examiner

*Primary Examiner* — Mohamad Musleh
(74) *Attorney, Agent, or Firm* — Abelman, Frayne & Schwab

(57) ABSTRACT

Disclosed is a magnetizing apparatus including: a placing table configured to place thereon a storage container storing a plurality of substrates; a magnetizing chamber configured to accommodate the storage container and apply a magnetic field to the plurality of substrates in the storage container; and a conveying mechanism configured to convey the storage container from the placing table into the magnetizing chamber.

10 Claims, 5 Drawing Sheets

MAGNETIZING APPARATUS AND MAGNETIZING METHOD

CROSS-REFERENCE TO RELATED APPLICATIONS

This application is based on and claims priority from Japanese Patent Application No. 2015-169219 filed on Aug. 28, 2015 with the Japan Patent Office, the disclosure of which is incorporated herein in its entirety by reference.

TECHNICAL FIELD

The present disclosure relates to a magnetizing apparatus and a magnetizing method.

BACKGROUND

As a semiconductor memory device, a magnetic random access memory (MRAM), which is one of non-volatile memories, has attracted attention. The MRAM is manufactured by performing a heat treatment on a magnetic film, which is formed on, for example, a semiconductor wafer (hereinafter, referred to as a "wafer"), in a magnetic field to express the magnetic characteristics thereof.

As an apparatus for expressing the magnetic characteristics on the magnetic film, a magnetic annealing apparatus has been known, which includes a magnetic field generating unit configured to apply a magnetic field to a wafer, and a heating unit provided along the inner circumference of the magnetic field generating unit and configured to heat the wafer (see, e.g., Japanese Patent Laid-Open Publication No. 2014-183280).

SUMMARY

In an exemplary embodiment, a magnetizing apparatus includes a placing table configured to place thereon a storage container storing a plurality of substrates; a magnetizing chamber configured to accommodate the storage container and apply a magnetic field to the plurality of substrates in the storage container; and a conveying mechanism configured to convey the storage container from the placing table into the magnetizing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described magnetic annealing apparatus, the magnetic characteristics are expressed on the magnetic film by transferring a plurality of wafers stored in a carrier to a wafer boat, carrying the wafer boat into the magnetic field generating unit, and then, performing a predetermined magnetic annealing on the wafers. Hence, when the wafers are transferred, dust may be generated, resulting in contamination of the wafers. Such contamination of the wafers may lower the reliability of the MRAM using the magnetic film.

Thus, in view of the above problem, an object of the present disclosure is to provide a magnetizing apparatus which can suppress contamination of substrates.

In order to achieve the object, in an exemplary embodiment, a magnetizing apparatus includes a placing table configured to place thereon a storage container storing a plurality of substrates; a magnetizing chamber configured to accommodate the storage container and apply a magnetic field to the plurality of substrates in the storage container; and a conveying mechanism configured to convey the storage container from the placing table into the magnetizing chamber.

In the above-described magnetizing apparatus, the storage container is a sealed type container made of a non-magnetic material, and the conveying mechanism conveys the storage container in a sealed state from the placing table into the magnetizing chamber.

In the above-described magnetizing apparatus, the storage container is a front opening unified pod (FOUP) capable of storing twenty five (25) substrates.

In the above-described magnetizing apparatus, the conveying mechanism grips the storage container from a top surface side of the storage container, and conveys the storage container.

In the above-described magnetizing apparatus, the magnetizing chamber applies a magnetic field to the plurality of substrates at room temperature.

In the above-described magnetizing apparatus, the magnetizing chamber includes: a vertical type solenoid magnet; a holding unit provided to be movable vertically inside the solenoid magnet and configured to hold the storage container; and a driving mechanism configured to move the holding unit vertically.

In the above-described magnetizing apparatus, the magnetizing chamber includes: a horizontal type solenoid magnet; a holding unit provided to be movable horizontally inside the solenoid magnet and configured to hold the storage container; and a driving mechanism configured to move the holding unit horizontally.

In the above-described magnetizing apparatus, the driving mechanism moves the holding unit between a position where the storage container is placed in the holding unit and a position where the magnetic field is applied to the plurality of substrates stored in the storage container.

In the above-described magnetizing apparatus, the solenoid type magnet is a superconducting magnet.

In another exemplary embodiment of the present disclosure, a magnetizing method includes placing a storage container storing a plurality of substrates on a placing table; conveying the storage container placed on the placing table into a magnetizing chamber; and applying a magnetic field to the plurality of substrates in the storage container conveyed into the magnetizing chamber.

According to the present exemplary embodiment, contamination of the substrate may be suppressed.

Hereinafter, the present exemplary embodiment will be described with reference to the accompanying drawings. In the present specification and drawings, components having substantially the same functional configurations will be denoted by the same symbols, and the overlapping descriptions thereof will be omitted.

By the way, the recent evaluation has revealed that the magnetic characteristics may be expressed on the magnetic film, which is formed on the wafers, at room temperature by applying a strong magnetic field of, for example, 1 T (Tesla) to 5 T thereto.

In the present exemplary embodiment, descriptions will be made on a magnetizing apparatus which may be suitably used in the case where magnetic characteristics are expressed at room temperature by applying a magnetic field to a magnetic film formed on a wafer that is an example of the substrate. In the following exemplary embodiment, a case of applying a strong magnetic field will be described by way of example. However, the magnetizing apparatus of the present exemplary embodiment may be applicable to any case other than the case of applying a strong magnetic field.

(Storage Container)

Figure 1:
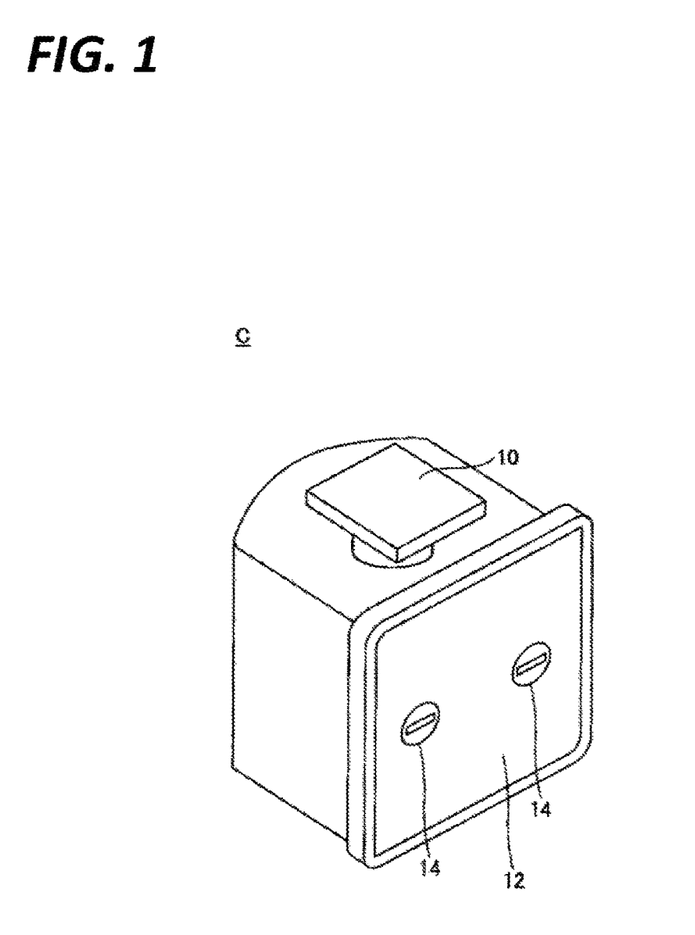
FIG. 1 is a schematic perspective view illustrating a storage container.

Descriptions will be made on a storage container that stores wafers used in a magnetizing apparatus of the present exemplary embodiment with reference to FIG. 1. FIG. 1 is a schematic perspective view illustrating a storage container.

A storage container C is also referred to as a carrier. As illustrated in FIG. 1, one end of the storage container C is formed as an opening, and the other end thereof is formed in a substantially semi-elliptical shape. The storage container C is a sealed type front opening unified pod (FOUP) made of, for example, a non-magnetic material. However, the storage container C is not limited to the FOUP, but may be another container capable of storing wafers W.

A support (not illustrated) is formed on the inner wall of the storage container C to place the wafers W in multi-tiers. The wafers W may be stored at a substantially equal pitch in multi-tiers by placing and supporting peripheral portions of, for example, 300-mm wafers W on the support. One storage container C may store, for example, twenty five (25) wafers W.

A grippable handle 10 is provided on the upper surface side (ceiling) of the storage container C to grip the storage container C.

In the opening of the storage container C, an opening/closing cover 12 corresponding to the opening is detachably provided. When the opening/closing cover 12 is closed, the storage container C is in an airtight state. The atmosphere inside the storage container C is a clean air.

The opening/closing cover 12 is provided with, for example, two lock mechanisms 14. Thus, the opening/closing cover 12 may be attached to or detached from the opening by locking or unlocking the lock mechanisms 14.

A plurality of recesses for positioning (not illustrated) are formed on the lower surface of the bottom portion of the storage container C to position the storage container C when placing the storage container C on a placing table (to be described later). In addition, a groove (not illustrated) is formed on the lower surface of the bottom portion of the storage container C to fix the storage container C when placing the storage container C on the placing table (to be described later).

(Magnetizing Apparatus)

[First Exemplary Embodiment]

Figure 2A:
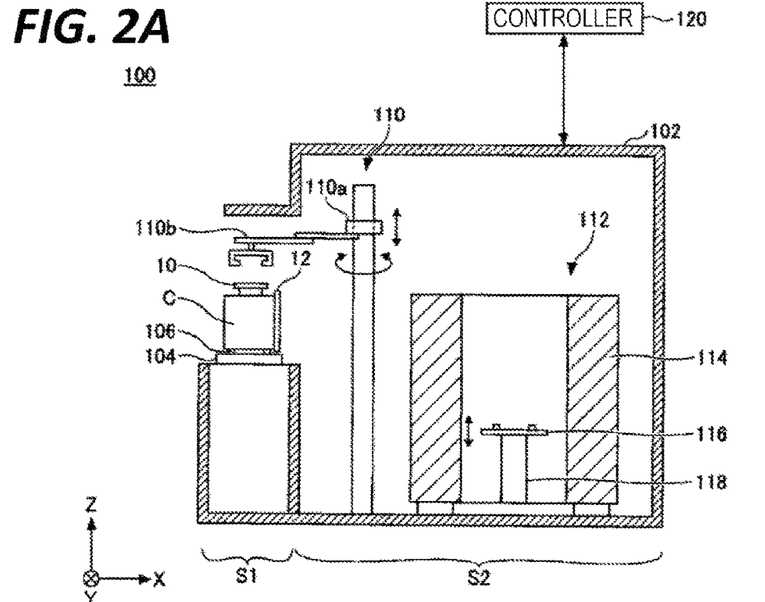
FIGS. 2A and 2B are schematic views of a magnetizing apparatus according to a first exemplary embodiment.
Figure 2B:
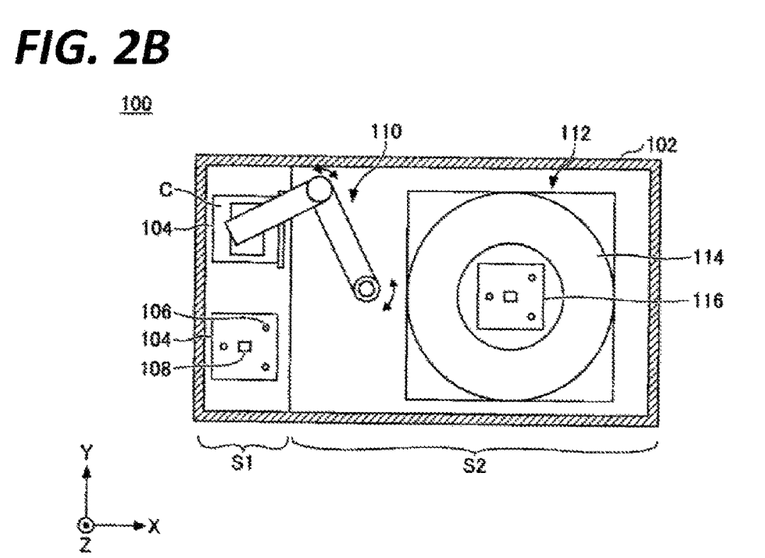

A magnetizing apparatus of a first exemplary embodiment will be described with reference to FIGS. 2A and 2B. FIGS. 2A and 2B are schematic views of a magnetizing apparatus according to a first exemplary embodiment. FIGS. 2A and 2B illustrate a vertical section and a top surface of the magnetizing apparatus, respectively. In the following descriptions, the longitudinal direction of the magnetizing apparatus is regarded as the X direction in FIGS. 2A and 2B, the horizontal direction is regarded as the Y direction, and the vertical direction is regarded as the Z direction.

As illustrated in FIGS. 2A and 2B, the magnetizing apparatus 100 includes a housing 102. A carrier placing region S1 and a carrier conveying region S2 are formed in the housing 102.

The carrier placing region S1 is a region in an air atmosphere, and a region for placing the storage container C that stores the wafers W. A region between processing apparatuses corresponds to the carrier placing region S1. In the present exemplary embodiment, a space in an external clean room of the magnetizing apparatus 100 corresponds to the carrier placing region S1. For example, two placing tables 104 are provided in the horizontal direction of the carrier placing region S1 to each place the storage container C. The number of the placing tables 104 may be one, or three or more.

As illustrated in FIG. 2B, pins 106 for positioning the storage container C are provided in, for example, three sites on the placing surface of the placing table 104, so that the storage container C is placed at a predetermined position of the placing table 104 by coupling the pins 106 and the recesses of the storage container C. Further, a hook 108 for fixing the storage container C is provided on the placing surface of the placing table 104, so that the storage container C is fixed to the placing table 104 by coupling the hook 108 and the groove of the storage container C.

The carrier conveying region S2 is a region in an air atmosphere, and a region for conveying the storage container C that stores the wafers W between the placing table 104 and the magnetizing chamber 112. Meanwhile, the carrier conveying region S2 may be in an inert gas atmosphere such as, for example, a nitrogen gas atmosphere. Further, a fan filter unit (FFU) may be provided in the carrier conveying region S2 from the viewpoint of suppressing dust or the like generated in the magnetizing apparatus from being diffused to the outside.

A carrier conveying mechanism 110 and a magnetizing chamber 112 are provided in the carrier conveying region S2.

The carrier conveying mechanism 110 is an example of a conveying mechanism capable of conveying the storage container C from the placing table 104 into the magnetizing chamber 112. In the present exemplary embodiment, the carrier conveying mechanism 110 conveys the storage container C in a sealed state. The carrier conveying mechanism 110 includes a liftable guide 110a, and a joint arm 110b provided in the guide 110a and configured to convey the storage container C in the horizontal direction while holding the handle 10 of the storage container C.

The magnetizing chamber 112 is a processing chamber that accommodates the storage container C, and expresses magnetic characteristics on the magnetic film formed on the wafers W by applying a magnetic field to the wafers W in the storage container C. The magnetizing chamber 112 includes a vertical type solenoid magnet 114 with the upper end (+Z direction in FIGS. 2A and 2B) opened.

The solenoid magnet 114 is disposed such that the central line axis direction thereof becomes perpendicular, and connected to a power source device (not illustrated). The solenoid magnet 114 may be, for example, a superconducting magnet. The direction of the magnetic field generated by the vertical type solenoid magnet 114 becomes the vertical direction. Further, a ferromagnetic member (e.g., pure iron) is provided to cover the solenoid magnet 114 from the outside. Thus, the magnetic field may be suppressed from leaking out from the magnetizing chamber 112.

A holding unit 116 and a vertical driving mechanism 118 are provided inside the solenoid magnet 114.

The holding unit 116 is provided to be vertically movable, and holds the storage container C. The holding unit 116 is made of a non-magnetic material. Further, a sensor (e.g., laser sensor) (not illustrated) may be provided to detect whether the storage container C is held at a predetermined position of the holding unit 116.

The vertical driving mechanism 118 moves the holding unit 116 vertically. Specifically, the vertical driving mechanism 118 moves up the holding unit 116 when the storage container C is carried into the magnetizing chamber 112 by the carrier conveying mechanism 110. When the holding unit 116 is moved up to the vicinity of the upper end of the solenoid magnet 114, the storage container C is placed on the holding unit 116 by the carrier conveying mechanism 110. Further, after the storage container C is placed on the holding unit 116, the vertical driving mechanism 118 moves down the holding unit 116, so that the storage container C is accommodated in the magnetizing chamber 112.

Further, the storage container C may be carried into the magnetizing chamber 112 by the carrier conveying mechanism 110 to be placed on the holding unit 116 without moving the holding unit 116 vertically by the vertical driving mechanism 118.

When uniform magnetic characteristics are expressed on the magnetic film formed on, for example, twenty five (25) wafers W by using the solenoid magnet 114, the wafers W need to be arranged in a region where the magnetic field becomes uniform (hereinafter, referred to as a "uniform magnetic field region") in order to perform a uniform processing on all the wafers W. The uniform magnetic field region of the solenoid magnet 114 occupies about 20% of the axis direction thereof.

Meanwhile, as illustrated in FIG. 2A, the magnetizing apparatus 100 includes a controller 120 configured by, for example, a computer. The controller 120 is provided with a memory and a data processing unit including a CPU, and the CPU is operated by a program. The program includes a command organized to cause the controller 120 to send a control signal to respective units of the magnetizing apparatus 100 such that respect processing steps are advanced. For example, the conveyance of the storage container C, the application of the magnetic field to the wafers W, and the movement of the holding unit 116 are performed by the control signal. The program is stored in a computer storage medium, for example, a storage medium such as a flexible disc, a compact disc, a hard disc, an optical magnetic disc, or a memory card, and installed to the controller 120.

Figure 3:
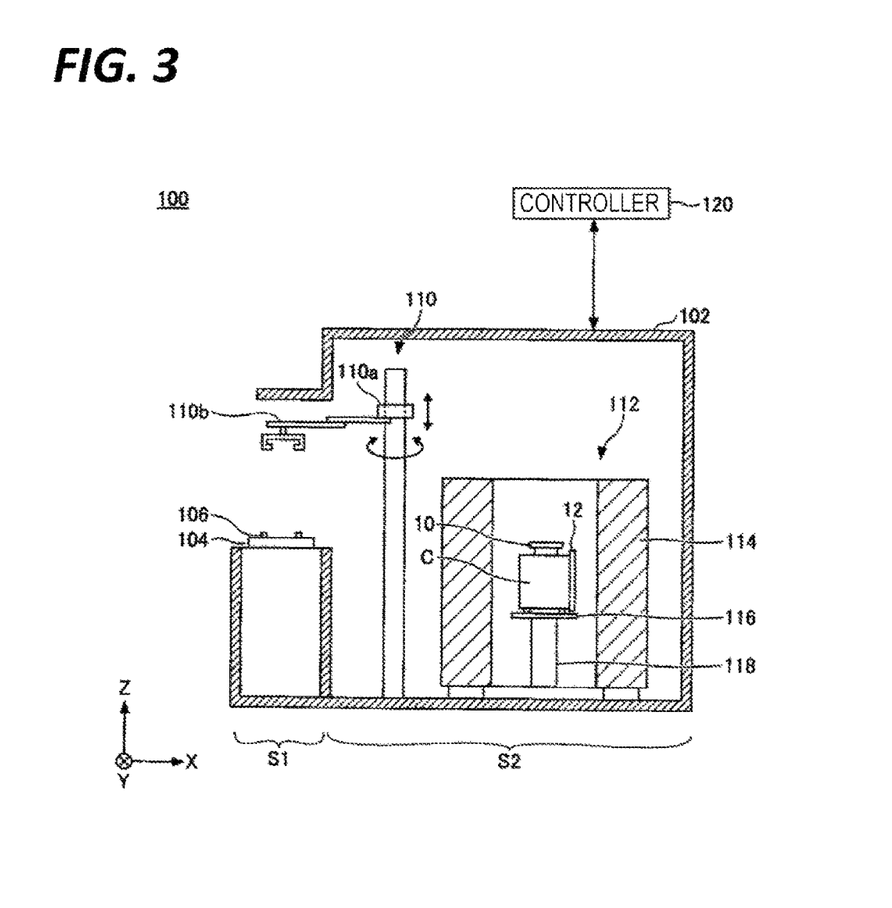
FIG. 3 is a view for describing a state where a storage container is accommodated in a magnetizing chamber.

Next, descriptions will be made on a magnetizing method for expressing magnetic characteristics on the magnetic film formed on the wafers W in the storage container C, with reference to FIGS. 2A, 2B, and 3. FIG. 3 is a view for describing a state where a storage container is accommodated in a magnetizing chamber.

First, as illustrated in FIGS. 2A and 2B, the storage container C is placed on the placing table 104 by, for example, an overhead hoist transport (OHT) or a rail guided vehicle (RGV) (not illustrated). At this time, for example, a plurality of (e.g., twenty five (25)) wafers W including a magnetic film formed thereon are stored in the storage container C.

Subsequently, as illustrated in FIG. 3, the storage container C placed on the placing table 104 is carried into the magnetizing chamber 112 in a state of storing the wafers W by the carrier conveying mechanism 110, and accommodated in the magnetizing chamber 112. Specifically, the holding unit 116 is moved up by the vertical driving mechanism 118, and the storage container C placed on the placing table 104 is placed on the holding unit 116 in a state of storing the wafers W by the carrier conveying mechanism 110. Thereafter, the holding unit 116 is moved down by the vertical driving mechanism 118, so that the storage container C is accommodated in the magnetizing chamber 112. At this time, the storage container C is accommodated in the magnetizing chamber 112 in a state of loading the wafers W in a direction in parallel with the direction of the magnetic field (the vertical direction) and storing the wafers W in a shelf form. That is, the wafers W are held in the storage container C in a state where the wafer plane is perpendicular to the direction of the magnetic field.

Subsequently, the magnetic characteristics are expressed on the magnetic film formed on the wafers W by applying the magnetic field to the wafers W in the storage container C by the storage container C. Specifically, the magnetic characteristics are expressed on the magnetic film formed on the wafers W by applying a magnetic field of 1 T to 5 T at room temperature. At this time, since the storage container C is accommodated in the magnetizing chamber 112 in a state of loading the wafers W in a direction in parallel with the direction of the magnetic field (the vertical direction) and storing the wafers W in a shelf form, the magnetic film formed on the wafers W is magnetized in a direction perpendicular to the film. Meanwhile, the magnetic film formed on the wafers W may be magnetized in an in-plane direction of the film by rotating the storage container C by the carrier conveying mechanism 110 such that the wafers W are loaded in a shelf form in a direction perpendicular to the direction of the magnetic field, and accommodating the storage container C in the magnetizing chamber 112. Further, the room temperature in the present exemplary embodiment refers to a temperature in a state where heating or cooling is not performed from the outside.

Subsequently, the storage container C is carried out from the magnetizing chamber 112, conveyed to the placing table 104, and placed thereon by the carrier conveying mechanism 110. Specifically, the holding unit 116 is moved up by the vertical driving mechanism 118, and the storage container C placed on the holding unit 116 is carried out, conveyed to the placing table 104, and placed thereon by the carrier conveying mechanism 110. Meanwhile, the storage container C placed on the placing table 104 is carried out from the placing table 104 by, for example, the overhead hoist transport (OHT) or the rail guided vehicle (RGV) (not illustrated). Thus, the processing is completed.

The magnetizing apparatus 100 of the present exemplary embodiment includes the carrier conveying mechanism 110 that conveys the storage container C from the placing table 104 into the magnetizing chamber 112, and a magnetizing chamber 112 that applies the magnetic field to the wafers W in the storage container C by the storage container C. Therefore, the wafers W may be conveyed between the placing table 104 and the magnetizing chamber 112 in a state of being stored in the storage container C without being taken out from the storage container C. Therefore, the wafers W may be suppressed from being contaminated by dust or the like generated when the wafers W are taken out from the storage container C, thereby manufacturing a highly reliable MRAM.

Further, the time required for the conveyance may be reduced, as compared with a case where the wafers are transferred from the storage container to a wafer boat and carried into the magnetizing chamber. Further, since it is unnecessary to transfer the wafers from the storage container to the wafer boat, an automatic opening/closing device for the opening/closing cover of the storage container, a wafer boat, and a transfer device for transferring the wafers from the storage container to the wafer boat are not required. Thus, the installation area (footprint) of the magnetizing apparatus may be reduced. In addition, since the number of parts is decreased, the manufacturing cost of the magnetizing apparatus may be reduced, and the time required for manufacturing the magnetizing apparatus may also be reduced.

Further, in the magnetizing apparatus 100 of the present exemplary embodiment, the storage container C is conveyed from the placing table 104 into the magnetizing chamber 112 in a sealed state by the carrier conveying mechanism 110. Therefore, even though the carrier conveying region S2 is not in an inert gas atmosphere, the surface of the wafers W may be suppressed from being naturally oxidized and covered by an oxide film. Thus, since it is unnecessary to introduce an inert gas facility, the manufacturing cost of the magnetizing apparatus 100 may be reduced, and the time required for manufacturing the magnetizing apparatus 100 may also be reduced.

[Second Exemplary Embodiment]

Figure 4A:
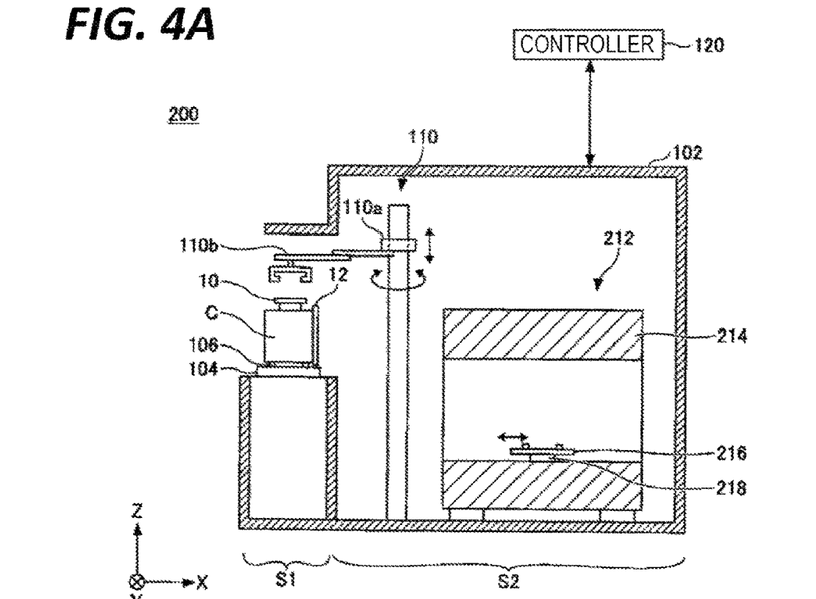
FIGS. 4A and 4B are schematic views of a magnetizing apparatus according to a second exemplary embodiment.
Figure 4B:
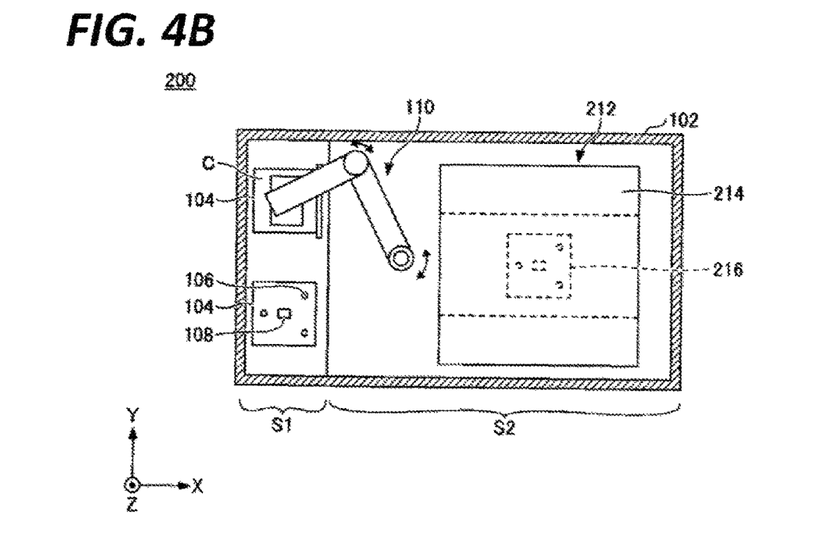

A magnetizing apparatus of a second exemplary embodiment will be described with reference to FIGS. 4A and 4B. FIGS. 4A and 4B are schematic views of a magnetizing apparatus according to a second exemplary embodiment. FIGS. 4A and 4B illustrate a vertical section and a top surface of the magnetizing apparatus, respectively. In the following descriptions, the longitudinal direction of the magnetizing apparatus is regarded as the X direction in FIGS. 4A and 4B, the horizontal direction is regarded as the Y direction, and the vertical direction is regarded as the Z direction.

As illustrated in FIGS. 4A and 4B, the magnetizing apparatus 200 includes a housing 102. A carrier placing region S1 and a carrier conveying region S2 are formed in the housing 102.

The carrier placing region S1 is a region in an air atmosphere, and a region for placing the storage container C that stores the wafers W. A region between processing apparatuses corresponds to the carrier placing region S1. In the present exemplary embodiment, a space in an external clean room of the magnetizing apparatus 200 corresponds to the carrier placing region S1. For example, two placing tables 104 are provided in the horizontal direction of the carrier placing region S1 to each place the storage container C. The number of the placing tables 104 may be one, or three or more.

As illustrated in FIG. 4B, pins 106 for positioning the storage container C are provided in, for example, three sites on the placing surface of the placing table 104, so that the storage container C is placed at a predetermined position of the placing table 104 by coupling the pins 106 and the recesses of the storage container C. Further, a hook 108 for fixing the storage container C is provided on the placing surface of the placing table 104, so that the storage container C is fixed to the placing table 104 by coupling the hook 108 and the groove of the storage container C.

The carrier conveying region S2 is a region in an air atmosphere, and a region for conveying the storage container C that stores the wafers W between the placing table 104 and the magnetizing chamber 212. Meanwhile, the carrier conveying region S2 may be in an inert gas atmosphere such as, for example, a nitrogen gas atmosphere. Further, an FFU may be provided in the carrier conveying region S2 from the viewpoint of suppressing dust or the like generated in the magnetizing apparatus from being diffused to the outside.

A carrier conveying mechanism 110 and a magnetizing chamber 212 are provided in the carrier conveying region S2.

The carrier conveying mechanism 110 is an example of a conveying mechanism capable of conveying the storage container C from the placing table 104 into the magnetizing chamber 212. In the present exemplary embodiment, the carrier conveying mechanism 110 conveys the storage container in a sealed state. The carrier conveying mechanism 110 includes a liftable guide 110a, and a joint arm 110b provided in the guide 110a and configured to convey the storage container C in the horizontal direction while holding the handle 10 of the storage container C.

The magnetizing chamber 212 is a processing chamber that accommodates the storage container C, and expresses magnetic characteristics on the magnetic film formed on the wafers W by applying a magnetic field to the wafers W in the storage container C. The magnetizing chamber 212 includes a horizontal type solenoid magnet 214 with the rear end (−X direction in FIGS. 4A and 4B) opened.

The solenoid magnet 214 is disposed such that the central line axis direction becomes horizontal, and connected to a power source device (not illustrated). The solenoid magnet 214 may be, for example, a superconducting magnet. The direction of the magnetic field generated by the horizontal type solenoid magnet 214 becomes the longitudinal direction. Further, a ferromagnetic member (e.g., pure iron) is provided to cover the solenoid magnet 214 from the outside. Thus, the magnetic field may be suppressed from leaking out from the magnetizing chamber 212.

A holding unit 216 and a longitudinal driving mechanism 218 are provided inside the solenoid magnet 214.

The holding unit 216 is provided to be vertically movable, and holds the storage container C. The holding unit 216 is made of a non-magnetic material. Further, a sensor (e.g., laser sensor) (not illustrated) may be provided to detect whether the storage container C is held at a predetermined position of the holding unit 216.

The longitudinal driving mechanism 218 moves the holding unit 216 longitudinally. Specifically, the longitudinal driving mechanism 218 moves the holding unit 216 rearward when the storage container C is carried into the magnetizing chamber 212 by the carrier conveying mechanism 110. When the holding unit 216 is moved to the vicinity of the rear end of the solenoid magnet 214, the storage container C is placed on the holding unit 216 by the carrier conveying mechanism 110. Further, after the storage container C is placed on the holding unit 216, the longitudinal driving mechanism 218 moves the holding unit 216 forward, so that the storage container C is accommodated in the magnetizing chamber 212.

Further, the storage container C may be carried into the magnetizing chamber 212 by the carrier conveying mechanism 110 to be placed on the holding unit 216 without moving the holding unit 216 longitudinally by the longitudinal driving mechanism 218.

When uniform magnetic characteristics are expressed on the magnetic film formed on, for example, twenty five (25) wafers W by using the solenoid magnet 214, the wafers W need to be arranged in a uniform magnetic field region in order to perform a uniform processing on all the wafers W. The uniform magnetic field region of the solenoid magnet 214 occupies about 20% of the axis direction thereof.

Meanwhile, as illustrated in FIG. 4A, the magnetizing apparatus 200 includes a controller 120 configured by, for example, a computer. The controller 120 is provided with a memory and a data processing unit including a CPU, and the CPU is operated by a program. The program includes a command organized to cause the controller 120 to send a control signal to respective units of the magnetizing apparatus 200 such that respect processing steps are advanced. For example, the conveyance of the storage container C, the application of the magnetic field to the wafers W, and the movement of the holding unit 216 are performed by the control signal. The program is stored in a computer storage medium, for example, a storage medium such as a flexible disc, a compact disc, a hard disc, an optical magnetic disc, or a memory card, and installed to the controller 120.

Figure 5:
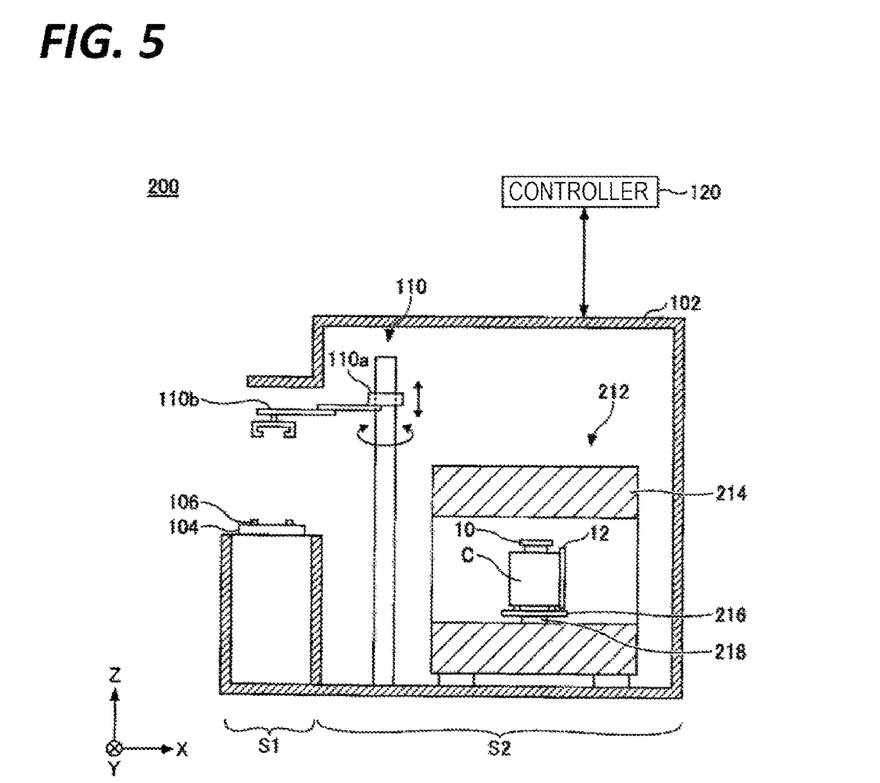
FIG. 5 is a view for describing a state where a storage container is accommodated in a magnetizing chamber.

Next, descriptions will be made on a magnetizing method for expressing magnetic characteristics on the magnetic film formed on the wafers W in the storage container C, with reference to FIGS. 4A, 4B, and 5. FIG. 5 is a view for describing a state where a storage container is accommodated in a magnetizing chamber.

First, as illustrated in FIGS. 4A and 4B, the storage container C is placed on the placing table 104 by an overhead hoist transport (OHT) or a rail guided vehicle (RGV) (not illustrated). At this time, for example, a plurality of (e.g., twenty five (25)) wafers W including a magnetic film formed thereon are stored in the storage container C.

Subsequently, as illustrated in FIG. 5, the storage container C placed on the placing table 104 is carried into the magnetizing chamber 212 in a state of storing the wafers W by the carrier conveying mechanism 110, and accommodated in the magnetizing chamber 112. Specifically, the holding unit 216 is moved rearward by the longitudinal driving mechanism 218, and the storage container C placed on the placing table 104 is placed on the holding unit 216 in a state of storing the wafers W by the carrier conveying mechanism 110. Thereafter, the holding unit 216 is moved forward by the longitudinal driving mechanism 218, so that the storage container C is accommodated in the magnetizing chamber 212. At this time, the storage container C is accommodated in the magnetizing chamber 212 in a state of loading the wafers W in a (vertical) direction perpendicular to the direction of the magnetic field (the longitudinal direction) and storing the wafers W in a shelf form. That is, the wafers W are held in the storage container C in a state where the wafer plane is in parallel with the direction of the magnetic field.

Subsequently, the magnetic characteristics are expressed on the magnetic film formed on the wafers W by applying the magnetic field to the wafers W in the storage container C by the storage container C. Specifically, the magnetic characteristics are expressed on the magnetic film formed on the wafers W by applying a magnetic field of 1 T to 5 T at room temperature. At this time, since the storage container C is accommodated in the magnetizing chamber 212 in a state of loading the wafers W in a (vertical) direction perpendicular to the direction of the magnetic field (the longitudinal direction) and storing the wafers W in a shelf form, the magnetic film formed on the wafers W is magnetized in an in-plane direction of the film. Meanwhile, the magnetic film formed on the wafers W may be magnetized in a direction perpendicular to the film by rotating the storage container C by the carrier conveying mechanism 110 such that the wafers W are loaded in a shelf form in a direction in parallel with the direction of the magnetic field (i.e., in the longitudinal direction), and accommodating the storage container C in the magnetizing chamber 212. Further, the room temperature in the present exemplary embodiment refers to a temperature in a state where heating or cooling is not performed from the outside.

Subsequently, the storage container C is carried out from the magnetizing chamber 212, conveyed to the placing table 104, and placed thereon by the carrier conveying mechanism 110. Specifically, the holding unit 216 is moved rearward by the longitudinal driving mechanism 218, and the storage container C placed on the holding unit 216 is carried out, conveyed to the placing table 104, and placed thereon by the carrier conveying mechanism 110. Meanwhile, the storage container C placed on the placing table 114 is carried out from the placing table 104 by, for example, the overhead hoist transport (OHT) or the rail guided vehicle (RGV) (not illustrated). Thus, the processing is completed.

The magnetizing apparatus 200 of the present exemplary embodiment includes the carrier conveying mechanism 110 that conveys the storage container C from the placing table 104 into the magnetizing chamber 212, and a magnetizing chamber 212 that applies the magnetic field to the wafers W in the storage container C by the storage container C. Therefore, the wafers W may be conveyed between the placing table 104 and the magnetizing chamber 212 in a state of being stored in the storage container C without being taken out from the storage container C. Therefore, the wafers W may be suppressed from being contaminated by dust generated when the wafers W are taken out from the storage container C, thereby manufacturing a highly reliable MRAM.

Further, the time required for the conveyance may be reduced, as compared with a case where the wafers are transferred from the storage container to a wafer boat and carried into the magnetizing chamber. Further, since it is unnecessary to transfer the wafers from the storage container to the wafer boat, an automatic opening/closing device for the opening/closing cover of the storage container, a wafer boat, and a transfer device for transferring the wafers from the storage container to the wafer boat are not required. Thus, the installation area (footprint) of the magnetizing apparatus may be reduced. In addition, since the number of parts is decreased, the manufacturing cost of the magnetizing apparatus may be reduced, and the time required for manufacturing the magnetizing apparatus may also be reduced.

Further, in the magnetizing apparatus 200 of the present exemplary embodiment, the storage container C is conveyed from the placing table 104 into the magnetizing chamber 212 in a sealed state by the carrier conveying mechanism 110. Therefore, even though the carrier conveying region S2 is not in an inert gas atmosphere, the surface of the wafers W may be suppressed from being naturally oxidized and covered by an oxide film. Thus, since it is unnecessary to introduce an inert gas facility, the manufacturing cost of the magnetizing apparatus 200 may be reduced, and the time required for manufacturing the magnetizing apparatus 200 may also be reduced.

The magnetizing apparatus and the magnetizing method have been described by means of exemplary embodiments, but the present disclosure is not limited to the exemplary embodiments, and various changes and modifications may be made within the scope of the present disclosure.

The magnetizing apparatus of the exemplary embodiment has been described with respect to a configuration in which the carrier conveying mechanism conveys the storage container horizontally while holding the handle of the storage container, but the present disclosure is not limited thereto. Any carrier conveying mechanism is available as long as it can convey the storage container between the placing table and the magnetizing chamber. For example, the carrier conveying mechanism may be configured to convey the storage container horizontally while supporting the bottom portion thereof.

The magnetizing apparatus of the exemplary embodiment has been described with respect to a configuration in which the magnetizing chamber accommodates one storage chamber and applies a magnetic field to a plurality of wafers in the storage container, but the present disclosure is not limited thereto. For example, the magnetizing chamber may be configured to accommodate a plurality of storage containers, and apply a magnetic field to a plurality of wafers in the plurality of storage containers at the same time. In this case, the size of the solenoid magnet may be designed so as to perform a uniform processing on all the wafers in the plurality of storage containers.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A magnetizing apparatus comprising:
    a placing table fixed in a first region and configured to place thereon a storage container storing a plurality of substrates;
    a magnetizing chamber placed in a second region and configured to accommodate the storage container and to apply a magnetic field to the plurality of substrates in the storage container; and
    a conveying mechanism configured to lift the storage container from the placing table and to convey the lifted storage container into the magnetizing chamber.

2. The magnetizing apparatus of claim 1, wherein the storage container is a sealed type container made of a non-magnetic material, and the conveying mechanism conveys the storage container in a sealed state from the placing table into the magnetizing chamber.

3. The magnetizing apparatus of claim 2, wherein the storage container is a front opening unified pod (FOUP) configured to store twenty five (25) substrates.

4. The magnetizing apparatus of claim 1, wherein the conveying mechanism grips the storage container from a top surface side of the storage container, and conveys the storage container.

5. The magnetizing apparatus of claim 1, wherein the magnetizing chamber applies a magnetic field to the plurality of substrates at room temperature.

6. The magnetizing apparatus of claim 1, wherein the magnetizing chamber includes:
    a vertical type solenoid magnet;
    a holding unit provided to be movable vertically inside the solenoid magnet and configured to hold the storage container; and
    a driving mechanism configured to move the holding unit vertically.

7. The magnetizing apparatus of claim 1, wherein the magnetizing chamber includes:
    a horizontal type solenoid magnet;
    a holding unit provided to be movable horizontally inside the solenoid magnet and configured to hold the storage container; and
    a driving mechanism configured to move the holding unit horizontally.

8. The magnetizing apparatus of claim 6, wherein the driving mechanism moves the holding unit between a position where the storage container is placed in the holding unit and a position where the magnetic field is applied to the plurality of substrates stored in the storage container.

9. The magnetizing apparatus of claim 6, wherein the solenoid magnet is a superconducting magnet.

10. A magnetizing method comprising:
    fixing a placing table in a first region;
    placing a storage container storing a plurality of substrates on a placing table;
    lifting, by a conveying mechanism, the storage container from the placing table;
    conveying the lifted storage container into a magnetizing chamber placed in the second region; and
    applying a magnetic field to the plurality of substrates in the storage container conveyed into the magnetizing chamber.

* * * * *